United States Patent [19]

Masuda

[11] Patent Number: 5,102,861
[45] Date of Patent: Apr. 7, 1992

[54] SUPERCONDUCTIVE MATERIALS IMPLANTED WITH PHOSPHORUS IONS AND PROCESS FOR PREPARING THE SAME

[75] Inventor: Kohzoh Masuda, Ibaraki, Japan

[73] Assignee: Nippon Valqua Industries, Ltd., Tokyo, Japan

[21] Appl. No.: 534,273

[22] Filed: Jun. 7, 1990

[30] Foreign Application Priority Data

Jun. 7, 1989 [JP] Japan .................................. 1-144479

[51] Int. Cl.$^5$ ...................... C01F 11/02; C01G 3/02; H01L 39/12
[52] U.S. Cl. ...................................... 505/1; 252/521; 501/123; 501/152; 505/780
[58] Field of Search ................... 505/1, 780; 501/123, 501/152; 252/521

[56] References Cited

FOREIGN PATENT DOCUMENTS 1027133 1/1984 Japan .
1192758 8/1989 Japan .
1290525 11/1989 Japan .

OTHER PUBLICATIONS

Logren "Group V, VI and VII Dopant effects on YBa$_2$ Cu$_3$ O$_x$," *Cevamz Developments* 1988 pp. 329–333.
Kanai "Dopant Effects on the Superconductivity in ... " *Jup. Jnl. Appl. Phys.* v. 28(4) Apr. 1989, pp. L551–L554.
Masuda "Ion Implantation Effect in High Tc Oxide ... " *Nucl. Instrum. Methods Phys.* B46 1990 pp. 284–286.

*Primary Examiner*—Paul Lieberman
*Assistant Examiner*—John Boyd
*Attorney, Agent, or Firm*—Wenderoth, Lind & Ponack

[57] ABSTRACT

Improvement in the superconducting transition temperature of superconductive materials which have perovskite structure or similar structure to perovskite such as typically Y-Ba-Cu-O type perovskite compounds is obtained by implanting phosphorus ion in the superconductive materials.

4 Claims, 1 Drawing Sheet

SUPERCONDUCTIVE MATERIALS IMPLANTED WITH PHOSPHORUS IONS AND PROCESS FOR PREPARING THE SAME

FIELD OF THE INVENTION

This invention relates to superconductive materials which offer no electrical resistance at a temperature below a critical temperature and a process for preparing the same. More particularly, it relates to a process for preparing novel superconductive materials characterized by increasing the critical temperature of the superconductive materials and to superconductive materials prepared by said process.

BACKGROUND OF THE INVENTION

Superconductivity is usually defined as a phenomenon wherein the electrical resistance of a material is totally vanished at a temperature below a given temperature specific to the material (the critical temperature of the material). Accordingly, the superconductive materials are drawing attention as materials for energy saving type power transmission systems and power storage systems which utilize the property of no electrical resistance, or as materials for nuclear magnetic resonance tomographic diagnostic apparatuses, electromagnetically levitated trains (linear motor cars), electric generators, superconductive magnets, accelerators, etc. In the field of electronics, the superconductive materials can be used as materials for memory elements, arithmetic elements or magnetic flux detectors by utilizing Josephson effect and magnetic flux quantization.

However, the critical temperature (Tc) of the superconductive material is very low. For example, the thus far well known superconductive materials must be cooled with very low temperature liquid helium (boiling point: 4.2° K) and the cost of the coolant is very expensive. The costly cooling prevented them from being popular. Accordingly, there is demand to develop a superconductive material having a high critical temperature (Tc).

OBJECT OF THE INVENTION

The present invention is intended to solve such problems associated with the prior art as mentioned above and an object of the present invention is to provide a process for preparing a novel superconductive material having a high critical temperature (Tc) so as to allow cooling cost to be reduced and energy to be saved.

The present inventors have eagerly made studies and found that when a superconductive material is implanted with a specific ion, there can be facilitated the formation of cooper pair which induce superconductivity by utilizing a specific crystalline coulomb field, and the critical temperature (Tc) of the superconductive material can be elevated. The present invention has been accomplished on the basis of the above finding.

SUMMARY OF THE INVENTION

The superconductive materials of the present invention are characterized by that the superconductive materials are implanted with phosphorus ion in a dose of at least $1 \times 10^{15}$ ions/cm$^2$.

The first process for preparing the superconductive materials of the present invention is characterized by comprising a step of implanting phosphorus ion in superconductive materials.

The second process for preparing the superconductive materials of the present invention is characterized by comprising a step of implanting phosphorus ion in superconductive materials obtained by depositing process.

Further, the present invention is characterized by that the above-mentioned superconductive materials are, for example, Y-Ba-Cu-O type superconductive materials.

Furthermore, the present invention is characterized by the fact that the amount of phosphorus ion with which a superconductive material is implanted is a dose of 4.8 to $8.0 \times 10^{15}$ ions/cm$^2$.

Another process for preparing the superconductive materials of the present invention is characterized by comprising a step of heat-treating the superconductive materials after implanting phosphorus ion in the superconductive materials.

DETAILED DESCRIPTION OF THE INVENTION

Figure 1:
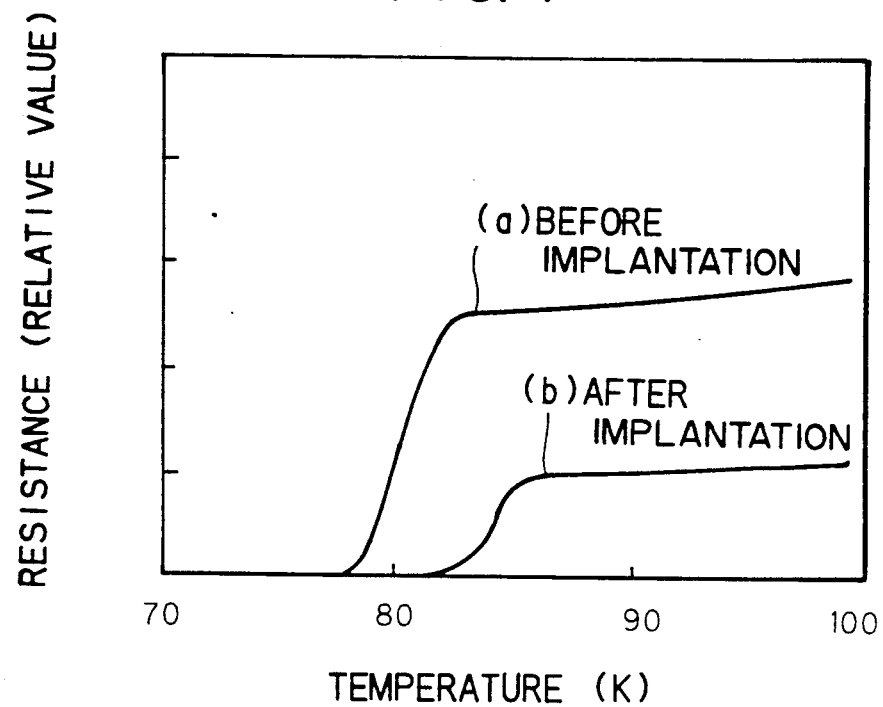
FIG. 1 is a graph showing temperature-resistivity characteristics before and after the implantation of phosphorus ion (P+) in $YBa_2Cu_3O_{7-\delta}$.

The superconductive materials of the present invention and the process for preparing the same are illustrated below in detail.

The superconductive materials to be implanted with phosphorus ion in the present invention have perovskite type crystal structure. Metals or non-metallic elements considered as excess components may be allowed to coexist therein, so long as they do not have an adverse effect on the achievement of the objects of the present invention.

Further, the present invention can be applied to other superconductive materials which have similar structure to perovskite.

Of the above-mentioned superconductive materials, Y-Ba-Cu-O based perovskite type compounds are particularly preferred.

The samples of these superconductive materials may be superconductive materials prepared by depositing process such as sputtering process and laser beam ablating process. In the present invention, samples prepared by sintering process may also be used.

Subsequently, the superconductive material prepared as mentioned above is used as a target (a material) and implanted with phosphorus ion (P+). Ion implanting apparatuses capable of irradiating phosphorus ion with good controllability are used when implantation is carried out.

Any of ion implanting apparatuses such as a radioisotope separator, tandem type pellethorone and ion implanting apparatus (9800 type, manufactured by Danfysik) can be used.

The amount of phosphorus ion (P+) with which the thus obtained superconductive film is implanted is a dose of at least 1.0 ($\times 10^{15}$ ions/cm$^2$), preferably 4.8 to $8.0 \times 10^{15}$ ions/cm$^2$ at a temperature of from ordinary temperature to 700° C. When the amount of phosphorus ion to be used for implantation is not more than $1.0 \times 10^{15}$ ions/cm$^2$, the binding energy for formation of the pair (cooper pair) carrying a superconducting state is not enhanced so that an increase in the critical temperature (Tc) can not be achieved and the effect of the present invention can not be obtained.

If desired, the superconductive materials may be heat-treated in an oxygen atmosphere after the implantation of phosphorus ion (P+). The reason for the heat treatment is to thermally eliminate the lattice defects in crystals occurred by ion implantation and to arrange atoms locally.

According to the present invention, the critical temperature of the superconductive materials can be elevated by implanting them with phosphorus ion (P+). The superconductive materials of the present invention and the process for preparing the same are industrially very useful.

The invention will be further illustrated by the following examples. It should be appreciated that the invention is not restricted to the examples.

EXAMPLE 1

A calcined product of a YBa$_2$Cu$_3$O$_{7-\delta}$ composition was used as a target, and magnesium oxide (MgO) was used as a substrate. In an oxygen atmosphere within a container having an ultimate vacuum of $10^{-6}$ Torr, there was deposited a thin film of a superconductive material composed of YBa$_2$Cu$_3$O$_{7-\delta}$, having a film thickness of 3000 Å on said substrate at a substrate temperature of 700° C. by pulse laser sputtering process. The resulting film was used as a sample.

The thus-formed film was a superconductive material having a composition of YBa$_2$Cu$_3$O$_{7-\delta}$ and a critical temperature (Tc) of 78° K.

The thin film of said superconductive material (YBa$_2$Cu$_3$O$_{7-\delta}$) was placed in the target chamber of an ion implanting apparatus and implanted with phosphorus ion (P+) accelerated to 120 KeV at ordinary temperature. The amount of phosphorus ion with which the thin film of the superconductive material was implanted was a dose of $6 \times 10^{15}$ ions/cm$^2$. After implantation, the sample was heat-treated at 920° C. for one hour. YBa$_2$Cu$_3$O$_{7-\delta}$ implanted with phosphorus ion (P+) in the manner described above was found to have a critical temperature (Tc) of 82° K. Accordingly, a novel superconductive material was prepared.

FIG. 1 is a graph showing resistivity-temperature characteristics before and after implantation of phosphorus ion (P+).

Figure 2:
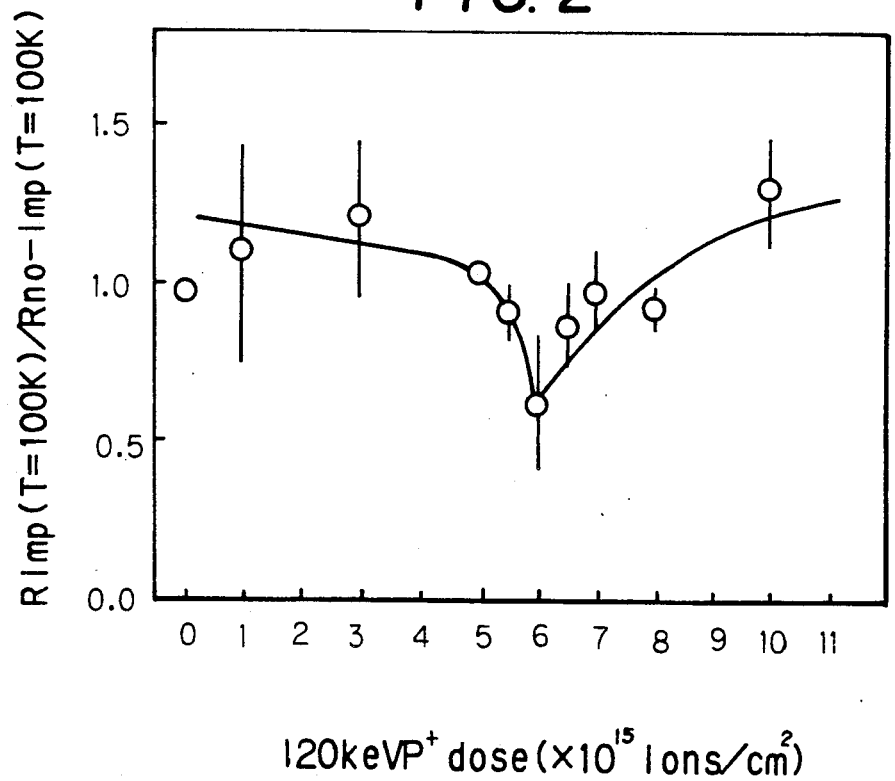
FIG. 2 is a graph showing a change in the ratio of the resistance of the phosphorus ion-implanted sample to the resistance of the sample containing no phosphorus ion (P+) against the dose of phosphorus ion (P+) with which the sample $YBa_2Cu_3O_{7-\delta}$ is implanted.

FIG. 2 is a graph showing a change in the ratio of the resistance of the phosphorus ion (P+) implanted sample to the resistance of the sample containing no phosphorus ion (P+) against the dose of implanted phosphorus ion (P+).

EXAMPLE 2

In an agate mortar, there were stirred 0.7575 g of Y$_2$O$_3$ powder, 2.6518 g of BaCO$_3$ powder and 1.6012 g of CuO powder for 30 minutes, each having a purity of not lower than 99.9%. Thus obtained mixture was placed in a crucible and sintered in an oxygen gas flow rate of 0.5 l/min at 950° C. for 16 hours. After sintering, the sintered product was crushed in the agate mortar and again sintered in an oxygen gas flow rate of 0.5 ml/min at 950° C. for 16 hours. After sintering, the sintered product was again crushed and pressed at a pressure of 5000 kg/cm$^2$ to prepare a sample of $10\phi \times 1$ mm. The sample was again sintered in an oxygen gas flow rate of 0.5 l/min at 950° C. for 16 hours.

In this way, a superconductive material having a composition of YBa$_2$Cu$_3$O$_{7-\delta}$ and a critical temperature (Tc) of 78° K was prepared.

The superconductive material having a composition of YBa$_2$Cu$_3$O$_{7-\delta}$ was planished, placed in the target chamber and implanted with phosphorus ion (P+) accelerated to 120 KeV. The implanted dose was $6 \times 10^{15}$ ions/cm$^2$. After implantation, the sample was heat-treated at 920° C. for one hour.

The thus-phosphorus ion (P+)-implanted YBa$_2$Cu$_3$O$_{7-\delta}$ was found to have a critical temperature (Tc) of 82° K. Thus, a novel superconductive material was prepared.

What is claimed is:

1. A Y-Ba-Cu-O type superconductive material implanted with phosphorus ions in a dose of from 4.8 to $8.0 \times 10^{15}$ ions/cm$^2$.

2. A process for preparing a Y-Ba-Cu-O type superconductive material which comprises implanting phosphorus ions in a Y-Ba-Cu-O type superconductive material wherein the dose of phosphorus ion with which the superconductive material is implanted is 4.8 to $8.0 \times 10^{15}$ ions/cm$^2$.

3. The process for preparing a Y-Ba-Cu-O type superconductive material as claimed in claim 2 wherein the superconductive material being implanted with phosphorus ions is obtained by a sputtering or laser beam ablating process.

4. The process for preparing a Y-Ba-Cu-O type superconductive material as claimed in claims 2 to 3, which comprises a step of heat-treatment of the superconductive material after implanting of phosphorus ions at about 920° C. for 1 hour.

* * * * *